(12) United States Patent
Tsutsumi et al.

(10) Patent No.: US 10,581,395 B2
(45) Date of Patent: Mar. 3, 2020

(54) VARIABLE GAIN AMPLIFIER

(71) Applicant: MITSUBISHI ELECTRIC CORPORATION, Tokyo (JP)

(72) Inventors: Koji Tsutsumi, Tokyo (JP); Takanobu Fujiwara, Tokyo (JP); Atsushi Kato, Tokyo (JP); Shinichi Inabe, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/085,953

(22) PCT Filed: Mar. 23, 2016

(86) PCT No.: PCT/JP2016/059193
§ 371 (c)(1),
(2) Date: Sep. 17, 2018

(87) PCT Pub. No.: WO2017/163334
PCT Pub. Date: Sep. 28, 2017

(65) Prior Publication Data
US 2019/0089318 A1 Mar. 21, 2019

(51) Int. Cl.
*H03F 3/45* (2006.01)
*H03G 3/10* (2006.01)
(Continued)

(52) U.S. Cl.
CPC ............ *H03G 3/10* (2013.01); *H03F 3/45179* (2013.01); *H03F 3/72* (2013.01); *H03G 1/0005* (2013.01); *H03G 1/0088* (2013.01)

(58) Field of Classification Search
CPC ...... H03G 3/10; H03G 1/0005; H03G 1/0088; H03G 1/0023; H03G 1/0029;
(Continued)

(56) References Cited

U.S. PATENT DOCUMENTS 7,321,266 B2 * 1/2008 Chiang .................. H03F 1/223
  330/254
8,736,370 B2 * 5/2014 Chiu .................... H03G 1/0029
  330/253
(Continued)

FOREIGN PATENT DOCUMENTS

JP     2007-221402 A      8/2007
JP     2007-259297 A     10/2007
(Continued)

OTHER PUBLICATIONS

Extended European Search Report issued in corresponding EP Application No. 16895370.1 dated Feb. 12, 2019.
(Continued)

*Primary Examiner* — Khanh V Nguyen
(74) *Attorney, Agent, or Firm* — Birch, Stewart, Kolasch & Birch, LLP

(57) ABSTRACT

A variable gain amplifier (1) includes: a signal transmission circuit (10, 20) including amplifying transistor units ($11_1$ to $11_N$, and $21_1$ to $21_N$) connected in parallel between a signal input port (2P, 2N) and a signal output port (3P, 3N); a load circuit (40) connected between a supply line of power supply voltage (VDD) and an output end of the signal transmission circuit (10, 20); a signal short circuit (30) including a short-circuit transistor unit (31) connected between the supply line of the power supply voltage (VDD) and an input end of the signal transmission circuit (10, 20), a constant-current source circuit (42), and a transistor control circuit (46). The transistor control circuit (46) selects transistor units to be turned on, from among the amplifying transistor units ($11_1$ to $11_N$, and $21_1$ to $21_N$) and the short-circuit transistor unit (31), and supplies control voltages for turning on the selected transistor units.

8 Claims, 6 Drawing Sheets

(51) Int. Cl.
*H03G 1/00* (2006.01)
*H03F 3/72* (2006.01)

(58) Field of Classification Search
CPC .... H03G 1/0035; H03G 3/00; H03G 2201/10; H03F 3/72; H03F 3/45179; H03F 3/45; H03F 3/45183
USPC ........................................................ 330/254
See application file for complete search history.

(56) References Cited

U.S. PATENT DOCUMENTS

| | | | |
|---|---|---|---|
| 9,088,253 B2* | 7/2015 | Kwon | .................... H03F 3/193 |
| 2003/0181181 A1 | 9/2003 | Darabi | |
| 2005/0052239 A1* | 3/2005 | Bosch | .................. H03G 1/0023 |
| | | | 330/254 |
| 2007/0159250 A1 | 7/2007 | Tsuchi et al. | |
| 2007/0222515 A1 | 9/2007 | Koutani et al. | |
| 2009/0085665 A1 | 4/2009 | Kousai | |

FOREIGN PATENT DOCUMENTS

| | | |
|---|---|---|
| JP | 2010-288007 A | 12/2010 |
| WO | WO 2008/102788 A1 | 8/2008 |

OTHER PUBLICATIONS

International Search Report for PCT/JP2016/059193 (PCT/ISA/210) dated Jun. 14, 2016.
Kato et al., "A X band High Accuracy Variable Gain and Phase Shift Block Consisted of Current Reuse Structures in SiGe-BiCMOS Technology", Proceedings of the 2015 IEICE Society Conference, C-2-6, p. 26, 2015.

* cited by examiner

FIG. 4

| Set Value of Gain (dB) | Comparative Example [Total Number of Differential Pairs = 90] | | | | | Example 1 (for Constant Current) [Total Number of Differential Pairs = 61] | | | | | Example 2 (for Variable Current) [Total Number of Differential Pairs = 61] | | | | |
|---|---|---|---|---|---|---|---|---|---|---|---|---|---|---|---|
| | np | nn | na | np + nn + na | Current Gain (dB) | Gain Error (dB) | np | nn | na | np + nn + na | Current Gain (dB) | Gain Error (dB) | np | nn | na | np + nn + na | Current Gain (dB) | Gain Error (dB) |
| 0 | 30 | 0 | 0 | 30 | 0.00 | 0.00 | 30 | 0 | 0 | 30 | 0.00 | 0.00 | 30 | 0 | 0 | 30 | 0.00 | 0.00 |
| −1 | 27 | 0 | 3 | 30 | −0.92 | 0.08 | 28 | 1 | 1 | 30 | −0.92 | 0.08 | 28 | 1 | 1 | 30 | −0.92 | 0.08 |
| −2 | 24 | 0 | 6 | 30 | −1.94 | 0.06 | 27 | 3 | 0 | 30 | −1.94 | 0.06 | 27 | 3 | 0 | 30 | −1.94 | 0.06 |
| −3 | 21 | 0 | 9 | 30 | −3.10 | −0.10 | 25 | 4 | 1 | 30 | −3.10 | −0.10 | 26 | 4 | 1 | 31 | −2.98 | 0.02 |
| −4 | 19 | 0 | 11 | 30 | −3.97 | 0.03 | 24 | 5 | 1 | 30 | −3.97 | 0.03 | 24 | 5 | 1 | 30 | −3.97 | 0.03 |
| −5 | 17 | 0 | 13 | 30 | −4.93 | 0.07 | 23 | 6 | 1 | 30 | −4.93 | 0.07 | 25 | 7 | 0 | 32 | −5.00 | 0.00 |
| −6 | 15 | 0 | 15 | 30 | −6.02 | −0.02 | 22 | 7 | 1 | 30 | −6.02 | −0.02 | 22 | 7 | 1 | 30 | −6.02 | −0.02 |
| −7 | 13 | 0 | 17 | 30 | −7.26 | −0.26 | 21 | 8 | 1 | 30 | −7.26 | −0.26 | 22 | 8 | 1 | 31 | −6.90 | 0.10 |
| −8 | 12 | 0 | 18 | 30 | −7.96 | 0.04 | 21 | 9 | 0 | 30 | −7.96 | 0.04 | 21 | 9 | 0 | 30 | −7.96 | 0.04 |
| −9 | 11 | 0 | 19 | 30 | −8.71 | 0.29 | 20 | 9 | 1 | 30 | −8.71 | 0.29 | 21 | 10 | 0 | 31 | −9.00 | 0.00 |
| −10 | 9 | 0 | 21 | 30 | −10.46 | −0.46 | 19 | 10 | 1 | 30 | −10.46 | −0.46 | 21 | 11 | 0 | 32 | −10.10 | −0.10 |
| −11 | 8 | 0 | 22 | 30 | −11.48 | −0.48 | 19 | 11 | 0 | 30 | −11.48 | −0.48 | 20 | 11 | 1 | 32 | −11.02 | −0.02 |
| −12 | 8 | 0 | 22 | 30 | −11.48 | 0.52 | 19 | 11 | 0 | 30 | −11.48 | 0.52 | 20 | 12 | 0 | 32 | −12.04 | −0.04 |
| −13 | 7 | 0 | 23 | 30 | −12.64 | 0.36 | 18 | 11 | 1 | 30 | −12.64 | 0.36 | 19 | 12 | 0 | 31 | −12.93 | 0.07 |
| −14 | 6 | 0 | 24 | 30 | −13.98 | 0.02 | 18 | 12 | 0 | 30 | −13.98 | 0.02 | 18 | 12 | 0 | 30 | −13.98 | 0.02 |
| −15 | 5 | 0 | 25 | 30 | −15.56 | −0.56 | 17 | 12 | 1 | 30 | −15.56 | −0.56 | 19 | 13 | 1 | 33 | −14.81 | 0.19 |

VARIABLE GAIN AMPLIFIER

TECHNICAL FIELD

The present invention relates to a variable gain amplifier for controlling the amplitude of a signal such as a radio-frequency signal.

BACKGROUND ART

Variable gain amplifiers are used for controlling the amplitudes of transmission signals and received signals in communication devices such as mobile phones. Variable gain amplifiers are also used in phase shifters for controlling the phases of signals. For example, in a vector-sum phase shifter, a variable gain amplifier is used to control the amplitudes of an in-phase signal and a quadrature signal having phases shifted by 90 degrees from each other, and add the resulting two signals to generate an output signal. Control of the respective gains of the in-phase signal and the quadrature signal enables control of the phase of the output signal.

Such a variable gain amplifier is disclosed in Patent Literature 1 (Japanese Patent Application Publication No. 2007-259297), for example. FIG. 7 is a schematic configuration diagram of a variable gain amplifier 100 of related art disclosed in Patent Literature 1. The variable gain amplifier 100 has a digitally controlled current-steering configuration. As illustrated in FIG. 7, the variable gain amplifier 100 includes a bipolar transistor Q1 for performing voltage-to-current conversion on a signal input from a signal input terminal 101 via a capacitor C1, a base-current supplying circuit 121 for supplying base current to the bipolar transistor Q1, a signal transmission circuit 111 including a plurality of transistors $P_1$ to $P_M$, a signal short circuit 110 including a plurality of transistors $A_1$ to $A_M$, and a gate-voltage control circuit 122 for selectively turning on or off the transistors $P_1$ to $P_M$, and $A_1$ to $A_M$. The signal transmission circuit 111 is connected between a collector terminal of the bipolar transistor Q1 and the signal output terminal 102, and the signal short circuit 110 is connected between the collector terminal and a supply line of power supply voltage VDD. In addition, a load resistor 113 is connected between the signal transmission circuit 111 and the supply line of the power supply voltage VDD. Furthermore, a ground potential VSS is applied to an emitter of the bipolar transistor Q1.

A current signal output from the collector terminal of the bipolar transistor Q1 is input to the signal transmission circuit 111 and the signal short circuit 110. The gate-voltage control circuit 122 is capable of controlling the total number (total sum of ratios W/L of gate widths W to gate lengths L) of transistors to be in a turned-on states among transistors $P_1$ to $P_M$, and $A_1$ to $A_M$ by controlling the gate voltage of each of the transistors $P_1$ to $P_M$, and $A_1$ to $A_M$. When the number of transistors in the turned-on states in the signal transmission circuit 111 is represented by np, and the number of transistors in the turned-on states in the signal short circuit 110 is represented by na, a current gain Di can be determined by the following expression:

$$Di = np/(np+na) = 1/(1+na/np).$$

The gate-voltage control circuit 122 makes an impedance constant as the signal transmission circuit 111 and the signal short circuit 110 are viewed from the collector terminal of the bipolar transistor Q1, by performing control to allow the value of the denominator np+na of the middle member of the expression to be constant.

CITATION LIST

Patent Literature

Patent Literature 1: Japanese Patent Application Publication No. 2007-259297 (FIG. 2).

SUMMARY OF INVENTION

Technical Problem

In the variable gain amplifier of the related art as described above, the current gain Di is determined by a ratio of np and na, which requires a large number of transistors in order to improve gain resolution. With an increased number of transistors, however, the parasitic capacitance is increased, which causes the problem that characteristics of variable gain amplifier are degraded in the high-frequency region.

In view of the foregoing, it is an object of the present invention to provide a variable gain amplifier capable of suppressing deterioration in high-frequency characteristics with a relatively small number of transistors.

Solution to Problem

In accordance with an aspect of the present invention, there is provided a variable gain amplifier which includes: a signal input port; a signal output port; a signal transmission circuit having an input end connected to the signal input port and an output end connected to the signal output port, and including a plurality of amplifying transistor units which are connected in parallel between the input end and the output end; a load circuit connected between a power supply line and the output end of the signal transmission circuit; a signal short circuit including at least one short-circuit transistor unit which is connected between the power supply line and the input end of the signal transmission circuit; a constant-current source circuit connected to the input end of the signal transmission circuit; and a transistor control circuit configured to select a prescribed number of transistor units to be turned on, from among the amplifying transistor units and the at least one short-circuit transistor unit, and configured to supply one or more control voltages for turning on the selected transistor units.

Advantageous Effects of Invention

According to the present invention, a variable gain amplifier capable of obtaining high gain resolution with a relatively small number of transistors and having excellent high-frequency characteristics is achieved.

BRIEF DESCRIPTION OF DRAWINGS

FIG. 4 is a diagram illustrating a table including numerical values showing the relation between the set value of gain and the actual gain.

DESCRIPTION OF EMBODIMENTS

Various embodiments according to the present invention will be described in detail below with reference to the drawings.

First Embodiment

Figure 1:
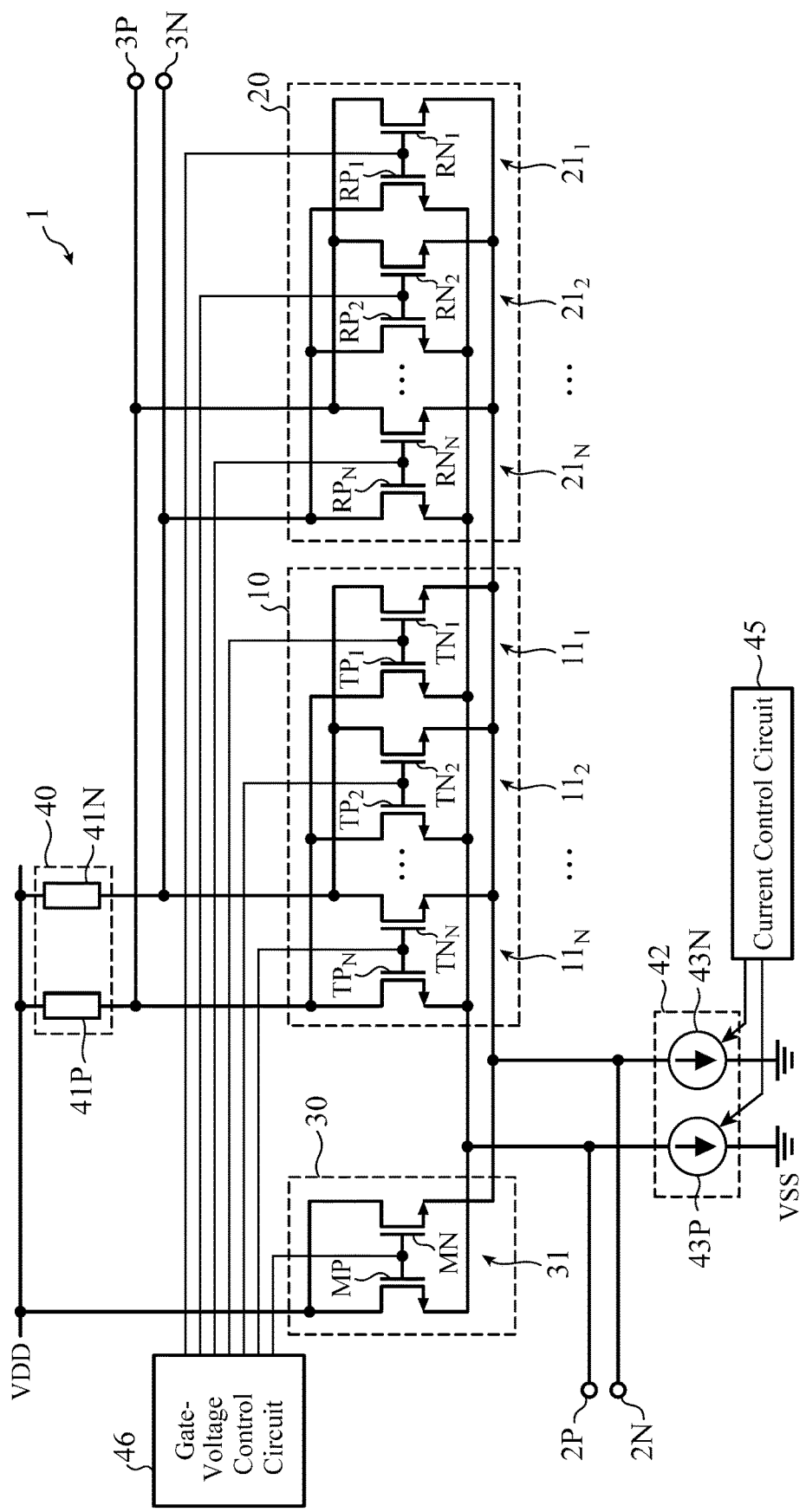
FIG. 1 is a schematic configuration diagram of a variable gain amplifier that is a first embodiment according to the present invention.

FIG. 1 is a schematic configuration diagram of a variable gain amplifier 1 that is a first embodiment according to the present invention. As illustrated in FIG. 1, the variable gain amplifier 1 has a digitally controlled current-steering configuration including a pair of signal input terminals 2P and 2N that receive differential input signals composed of a positive-phase input signal and a negative-phase input signal as a pair thereto, and a pair of signal output terminals 3P and 3N that output differential output signals composed of a positive-phase output signal and a negative-phase output signal as a pair. The positive-phase input signal is input to the signal input terminal (first signal input terminal) 2P, and the negative-phase input signal having a negative phase, which is an inverse of the phase of the positive-phase input signal, is input to the signal input terminal (second signal input terminal) 2N. In addition, the signal output terminal (first signal output terminal) 3P outputs the positive-phase output signal, and the signal output terminal (second signal output terminal) 3N outputs the negative-phase output signal. Note that the pair of signal input terminals 2P and 2N constitute a signal input port in the present embodiment, and the pair of signal output terminals 3P and 3N constitute a signal output port in the present embodiment.

As illustrated in FIG. 1, the variable gain amplifier 1 includes a non-inverted signal transmission circuit 10 including N (N is an integer equal to or larger than 3) amplifying transistor units $11_1$ to $11_N$, an inverted signal transmission circuit 20 including N amplifying transistor units $21_1$ to $21_N$, and a signal short circuit 30 including a transistor unit 31 for signal line short circuiting. Combination of these non-inverted signal transmission circuit 10 and inverted signal transmission circuit 20 constitutes a signal transmission circuit in the present embodiment.

The variable gain amplifier 1 also includes a load circuit 40 connected between a supply line for first power supply voltage VDD and an output end of the signal transmission circuit (non-inverted signal transmission circuit 10 and inverted signal transmission circuit 20), a constant-current source circuit 42 connected between a supply line for second power supply voltage VSS (VSS<VDD) and an input end of the signal transmission circuit, and a gate-voltage control circuit 46 that functions as a transistor control circuit. The gate-voltage control circuit 46 selects a combination of transistor units to be turned on from the amplifying transistor units $11_1$ to $11_N$, and $21_1$ to $21_N$ and the transistor unit 31 for signal line short circuiting, and supplies control voltage for turning on the selected combination of the transistor units to the amplifying transistor units $11_1$ to $11_N$, $21_1$ to $21_N$ and the transistor unit 31. As will be described later, the variable gain of the variable gain amplifier 1 is determined depending on the selected combination of the transistor units. Note that the power supply voltage VSS can be a ground potential of zero volts, for example.

Furthermore, the variable gain amplifier 1 includes the constant-current source circuit 42 connected to an input end of the non-inverted signal transmission circuit 10 and an input end of the inverted signal transmission circuit 20, and a current control circuit 45 for variably controlling the amounts of two currents flowing through the constant-current source circuit 42. The constant-current source circuit 42 is constituted by two variable constant-current sources 43P and 43N. One end of one variable constant-current source (first constant-current source) 43P is connected to the signal input terminal 2P, and one end of the other variable constant-current source (second constant-current source) 43N is connected to the signal input terminal 2N. The other ends of the variable constant-current sources 43P and 43N are connected to the supply line of the second power supply voltage VSS. The current control circuit 45 is capable of variably and individually controlling the amounts of two currents each flowing through the respective one of the variable constant-current sources 43P and 43N.

The load circuit 40 is constituted by two load resistors 41P and 41N each made of a resistive element. The load circuit 40 is connected between the supply line of the first power supply voltage VDD and an output end of the non-inverted signal transmission circuit 10 and between the supply line of the first power supply voltage VDD and the inverted signal transmission circuit 20. One end of the load resistor 41P and one end of the load resistor 41N are both connected to the supply line of the first power supply voltage VDD.

The transistor unit $11_1$ to $11_N$ included in the non-inverted signal transmission circuit 10 are each constituted by a pair of field-effect transistors for signal amplification, and the field-effect transistors (hereinafter, the field-effect transistors will also be simply referred to as "transistors") of each pair are connected in parallel with each other. Specifically, an n-th (n is any integer from 1 to N) transistor unit $11_n$ is constituted by a pair of amplifying transistors $TP_n$ and $TN_n$ connected in parallel with each other. The amplifying transistors $TP_n$ and $TN_n$ can be constituted by n-channel metal-oxide-semiconductor field effect transistors (MOSFETs), for example.

Gates of the amplifying transistors $TP_n$ and $TN_n$ are both connected to the gate-voltage control circuit 46. The gate-voltage control circuit 46 is capable of switching the operation state of each of the amplifying transistors $TP_n$ and $TN_n$ to either a turned-on state or a turned-off state by applying control voltages to the gates. The amplifying transistors $TP_n$ and $TN_n$ when being turned on are controlled so as to serve as grounded-gate transistors with fixed gate voltages.

In addition, the non-inverted signal transmission circuit 10 includes amplifying transistors $TP_1$ to $TP_N$ constituting a first transistor group connected between the signal input terminal 2P for the positive phase and the signal output terminal 3P for the positive phase, and amplifying transistors $TN_1$ to $TN_N$ constituting a second transistor group connected between the signal input terminal 2N for the negative phase and the signal output terminal 3N for the negative phase. Drains (output ends) of the amplifying transistors $TP_1$ to $TP_N$ are connected to the other end of the load resistor 41P. In addition, drains (output ends) of the amplifying transistors $TN_1$ to $TN_N$ are connected to the other end of the load resistor 41N. Sources (input ends) of the amplifying transistors $TP_1$ to $TP_N$ are connected to both of the signal input terminal 2P for the positive phase and one end of the variable constant-current source 43P. Furthermore, sources (input ends) of the amplifying transistors $TN_1$ to $TN_N$ are connected to both of the signal input terminal 2N for the negative phase and one end of the variable constant-current source 43N.

The transistor unit $21_1$ to $21_N$ included in the inverted signal transmission circuit 20 are each constituted by a pair of transistors for signal amplification, and the transistors of each pair are connected in parallel with each other. Specifically, an n-th transistor unit $21_n$ is constituted by a pair of amplifying transistors $RP_n$ and $RN_n$ connected in parallel with each other. These amplifying transistors $RP_n$ and $RN_n$ can be constituted by n-channel MOSFETs, for example.

Gates of the amplifying transistors $RP_n$ and $RN_n$ are both connected to the gate-voltage control circuit 46. The gate-voltage control circuit 46 is capable of switching the operation state of each of the amplifying transistors $RP_n$ and $RN_n$ to either a turned-on state or a turned-off state by applying control voltages to the gates. The amplifying transistors $RP_n$ and $RN_n$ when being turned on are controlled to serve as grounded-gate transistors with fixed gate voltages.

In addition, the inverted signal transmission circuit 20 includes amplifying transistors $RP_1$ to $RP_N$ constituting a third transistor group connected between the signal input terminal 2P for the positive phase and the signal output terminal 3N for the negative phase, and amplifying transistors $RN_1$ to $RN_N$ constituting a fourth transistor group connected between the signal input terminal 2N for the negative phase and the signal output terminal 3P for the positive phase. Drains (output ends) of the amplifying transistors $RP_1$ to $RP_N$ are connected to the other end of the load resistor 41N. In addition, drains (output ends) of the amplifying transistors $RN_1$ to $RN_N$ are connected to the other end of the load resistor 41P. Sources (input ends) of the amplifying transistors $RP_1$ to $RP_N$ are connected to both of the signal input terminal 2P for the positive phase and one end of the variable constant-current source 43P. Furthermore, sources (input ends) of the amplifying transistors $RN_1$ to $RN_N$ are connected to both of the signal input terminal 2N for the negative phase and one end of the variable constant-current source 43N.

The signal short circuit 30 is connected between the supply line of the first power supply voltage VDD and the input end of the non-inverted signal transmission circuit 10 and between the supply line of the first power supply voltage VDD and the input end of the inverted signal transmission circuit 20. The transistor unit 31 included in the signal short circuit 30 is constituted by a pair of transistors MP and MN connected in parallel with each other. A source of one amplifying transistor MP of the pair is connected to the signal input terminal 2P for the positive phase, and a source of the other amplifying transistor MN is connected to the signal input terminal 2N for the negative phase. In addition, drains of the amplifying transistors MP and MN are both connected to the supply line of the first power supply voltage VDD. The transistors MP and MN when being turned on are controlled to serve as grounded-gate transistors with fixed gate voltages.

While the number of transistor unit $11_1$ to $11_N$ included in the non-inverted signal transmission circuit 10 is equal to or larger than three in the configuration of FIG. 1, the number is not limited thereto, but may be two. Similarly, the number of transistor unit $21_1$ to $21_N$ included in the inverted signal transmission circuit 20 is not limited to be equal to or larger than three, but may be two. Furthermore, while the number of transistor unit $11_1$ to $11_N$ included in the non-inverted signal transmission circuit 10 and the number of transistor unit $21_1$ to $21_N$ included in the inverted signal transmission circuit 20 are equal in the configuration of FIG. 1, the numbers are not limited thereto.

Next, operation of the variable gain amplifier 1 will be explained. Positive-phase and negative-phase signal currents input to the signal input terminals 2P and 2N each flow into the non-inverted signal transmission circuit 10, the inverted signal transmission circuit 20, and the signal short circuit 30. Since the constant-current source circuit 42 is a high impedance circuit that applies a constant amount of current, the signal currents do not flow into the constant-current source circuit 42. The gate-voltage control circuit 46 selects a combination of transistor pairs to be turned on depending on a set value of the gain from the transistor pairs included in the non-inverted signal transmission circuit 10, the inverted signal transmission circuit 20, and the signal short circuit 30. The signal currents are amplified with a gain depending on the combination, and output through the signal output terminals 3P and 3N.

The gate-voltage control circuit 46 can select a combination of transistor pairs to be turned on from the transistor pairs included in each of the non-inverted signal transmission circuit 10 and the inverted signal transmission circuit 20 by using a bit string called a thermometer code, for example. A thermometer code is a bit string expressed in binary notation, which is generated by sequentially allocating a value of 1 from the uppermost bit or the lowermost bit. Each of the bits of the thermometer code is associated one-to-one with one of the transistor pair. The gate-voltage control circuit 46 can convert the number of transistor pairs to be turned on into a thermometer code, and then generate a control voltage group for turning on transistor pairs associated with bits with a value of 1 (or a value of 0) in the thermometer code and turning off transistor pairs associated with bits with a value of 0 (or a value of 1) in the thermometer code. For example, in a case of a thermometer code having a length of six bits, when a number n is given as the number of transistor pairs to be turned on, the thermometer code can have one of the values "000000" (n=0), "000001" (n=1), "000011" (n=2), "000111" (n=3), "001111" (n=4), "011111" (n=5) and "111111" (n=6). Thus, use of a thermometer code with a length of six bits allows the gate-voltage control circuit 46 to select a combination of transistor pairs to be turned on from among six transistor pairs.

When the number of transistor pairs controlled to be in the turned-on states in the non-inverted signal transmission circuit 10 is represented by np, the number of transistor pairs controlled to be in the turned-on states in the inverted signal transmission circuit 20 is represented by nn, and the number of transistor pairs controlled to be in the turned-on states in the signal short circuit 30 is represented by na, a current gain Bi between the signal input terminals 2P and 2N and the signal output terminals 3P and 3N is expressed by the following expression (1):

$$Bi=(np-nn)/(np+nn+na). \tag{1}$$

Note that, since the signal short circuit 30 includes only one pair of transistors, na has a value of zero or one. In a case of np<nn, the current gain Bi has a negative value. This means that a signal is output with a negative phase.

Note that a gain of a high-frequency circuit is often expressed by a power gain, which is a ratio of an input power and an output power. Although Bi described above is not a power gain but a current gain, there is no problem in assuming that a gain of a high-frequency circuit is a current gain as a relative value since the current gain and the power gain satisfy a constant ratio when the input impedance of the circuit is constant. Thus, so as to make the input impedance constant, the variable gain amplifier 1 of the present embodiment has two kinds of operation modes (a first operation mode and a second operation mode).

First, the first operation mode will be explained. When the variable gain amplifier 1 operates in the first operation mode, the gate-voltage control circuit 46 always makes constant the sum np+nn+na in the above expression (1), and the current control circuit 45 always makes constant the amount of current flowing through the constant-current source circuit 6.

In the variable gain amplifier 1 of the present embodiment, the input impedance $Z_{in}$ is expressed by the following expression (2) when the impedance of the constant-current source circuit 42 is assumed to be ideally infinite:

$$Z_{in} = 1/\{(np+nn+na) \times g_m\}. \quad (2)$$

In the expression, $g_m$ represents transconductance per unit transistor, the transconductance $g_m$ being constant when the amount of current flowing through the unit transistor is constant. Thus, when the sum np+nn+na is a constant value, the input impedance $Z_{in}$ is also a constant value. A unit transistor in the present embodiment is each transistor pair having a corresponding size when np=1, nn=1, or na=1.

Next, the second operation mode will be explained. When the variable gain amplifier 1 operates in the second operation mode, the gate-voltage control circuit 46 and the current control circuit 45 make constant the product of the sum np+nn+na and the amount of current flowing through the constant-current source circuit 42.

When a simplest model is given, the transconductance $g_m$ is expressed by the following expression (3) with respect to the current Id flowing through a unit transistor:

$$g_m \propto (Id)^{1/2}. \quad (3)$$

Thus, the transconductance $g_m$ is proportional to $(Id)^{1/2}$. In addition, when the amounts of two currents flowing through the variable constant-current sources 43P and 43N of the constant-current source circuit 42 are equal, the following relational expression (4) is satisfied where the amount of current is represented by $I_{tail}$:

$$I_{tail} = (np+nn+na) \times Id. \quad (4)$$

Thus, the input impedance $Z_{in}$ is expressed by the following expression (5):

$$Z_{in} \propto /\{(np+nn+na) \times I_{tail}\}^{1/2}. \quad (5)$$

Thus, even in a case where the sum np+nn+na is not constant, the input impedance $Z_{in}$ can be made constant in such a manner that the amount of current $I_{tail}$ is controlled so that $(np+nn+na) \times I_{tail}$ is constant.

The effectiveness of the present embodiment will be explained below with reference to Examples 1 and 2 of the present embodiment and a comparative example. Configurations of Examples 1 and 2 and the comparative example are as described below.

EXAMPLE 1

Example 1 operates in the first operation mode. The number of transistor pairs (transistor units $11_1$ to $11_N$) included in the non-inverted signal transmission circuit 10 is 30 (N=30), and the number of transistor pairs (transistor units $21_1$ to $21_N$) included in the inverted signal transmission circuit 20 is also 30. In addition, Example 1 is assumed to be a circuit capable of performing variable gain control with a step size of 1 dB within a range of 0 to −15 dB. Note that the number na of transistor pairs included in the signal short circuit 30 is one.

EXAMPLE 2

Example 2 operates in the second operation mode. The number of transistor pairs (transistor units $11_1$ to $11_N$) included in the non-inverted signal transmission circuit 10 is 30 (N=30), and the number of transistor pairs (transistor units $21_1$ to $21_N$) included in the inverted signal transmission circuit 20 is also 30. In addition, Example 2 is assumed to be a circuit capable of performing variable gain control with a step size of 1 dB within a range of 0 to −15 dB. Note that the number na of transistor pairs included in the signal short circuit 30 is one.

COMPARATIVE EXAMPLE

Figure 2:
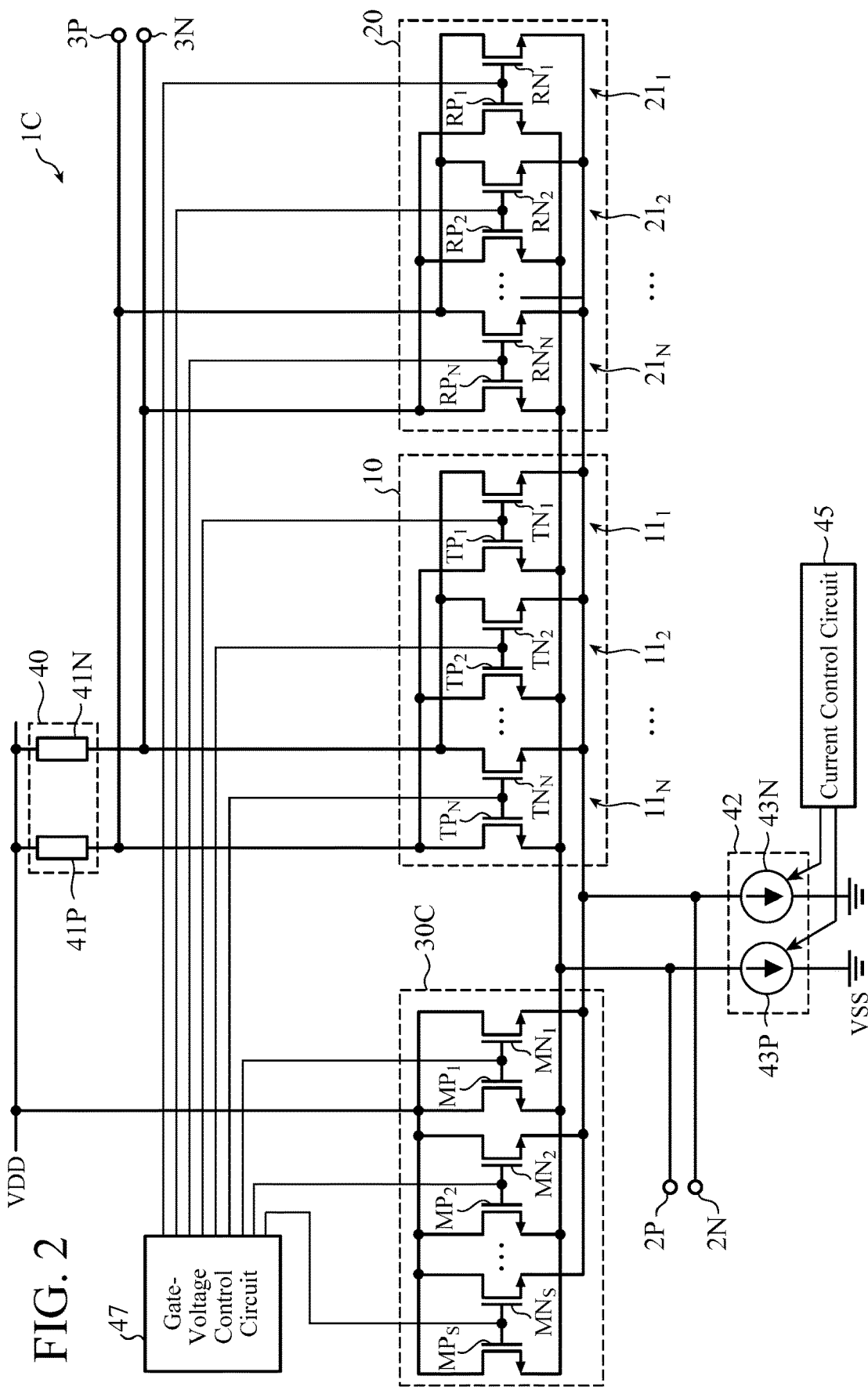
FIG. 2 is a schematic configuration diagram of a variable gain amplifier that is a comparative example.

FIG. 2 is a schematic configuration diagram of a variable gain amplifier 1C that is a comparative example. As illustrated in FIG. 2, the configuration of the comparative example is the same as that of the variable gain amplifier 1 of the present embodiment except that the signal short circuit 30 in FIG. 1 is replaced by a signal short circuit 30C and that the gate-voltage control circuit 46 in FIG. 1 is replaced by a gate-voltage control circuit 47. The signal short circuit 30C includes 30 (S=30) transistor pairs, each constituted by transistors $MP_i$ and $MN_i$ (i=any of 1 to 30) having the same configuration as that of the transistors MP and MN. In addition, in the comparative example, the number of transistor pairs (transistor units $11_1$ to $11_N$) included in the non-inverted signal transmission circuit 10 is 30, and the number of transistor pairs (transistor units $21_1$ to $21_N$) included in the inverted signal transmission circuit 20 is also 30. The gate-voltage control circuit 47 performs control so that the number (=np+nn+na) of transistor pairs in the turned-on states of the signal short circuit 30C, the non-inverted signal transmission circuit 10, and the inverted signal transmission circuit 20 is always 30. Note that na represents the number of transistor pairs in the turned-on states in the signal short circuit 30C. Furthermore, the comparative example is assumed to be a circuit capable of performing variable gain control with a step size of 1 dB within a range of 0 to −15 dB.

Figure 3A:
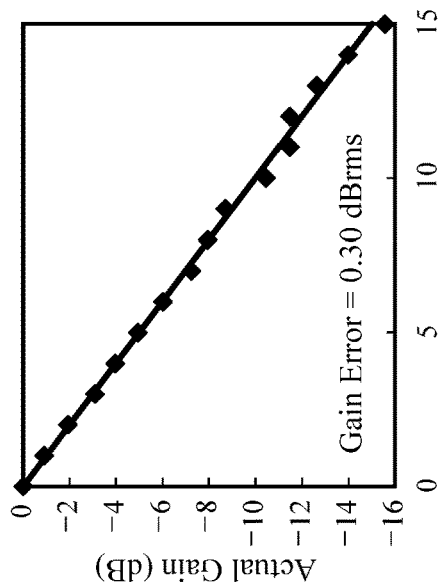
FIGS. 3A, 3B and 3C are graphs showing the relation between a set value of gain and an actual gain.
Figure 3B:
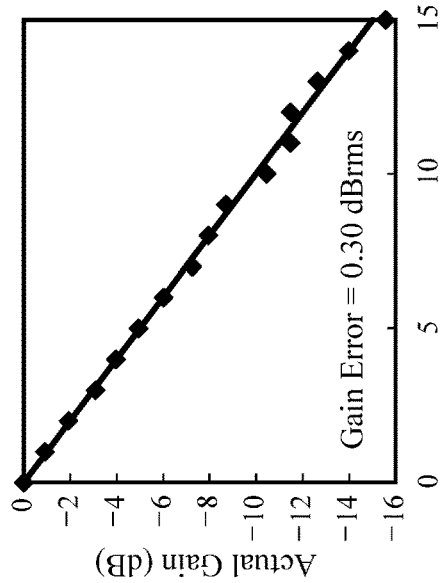
Figure 3C:
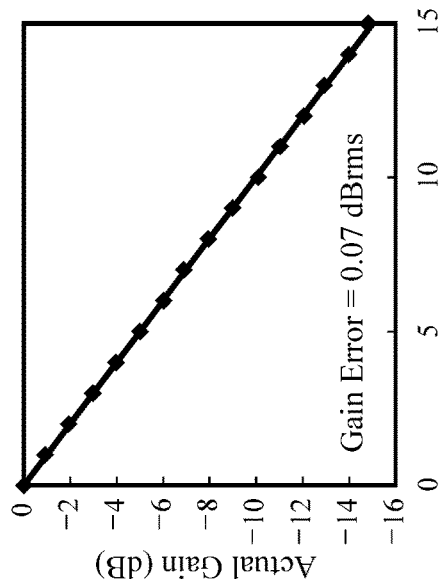

FIGS. 3A to 3C are graphs illustrating the relation between a set value of gain and a gain that is actually obtained (hereinafter also referred to as "actual gain"). The value of the actual gain is a current gain value calculated on the basis of the expression (1) (unit: dB). When a set value of the gain is given, a combination (np, nn, na) with which an actual gain that is closest to the set value is obtained is selected. In the graphs of FIGS. 3A to 3C, the horizontal axes of represent the absolute value of the set value of the gain (unit: dB), and the vertical axes represent the value of the actual gain (unit: dB). In addition, FIG. 3A shows numerical values in the comparative example, FIG. 3B shows numerical values in Example 1, and FIG. 3C shows numerical values in Example 2. FIG. 4 is a diagram illustrating a table showing calculated values on which the graphs are based. In the table of FIG. 4, "total number of differential pairs" represents the total number of transistor pairs.

In the case of the comparative example, as shown in FIG. 3A, the rms value of error of the actual gain (hereinafter referred to as "gain error") with respect to the set value of the gain is 0.30 dB. Note that an rms value refers to a root mean square value. In contrast, in the case of Example 1, as shown in FIG. 3B, the rms value of the gain error is 0.30 dB, which is approximately the same value as that in the comparative example. This shows that, although the number of transistor pairs (total number of differential pairs) in Example 1 is about two-thirds the number of transistor pairs (total number of differential pairs) in the comparative example, Example 1 achieves the characteristics equivalent to those in the comparative example. In addition, in the case of Example 2, a combination (np, nn, na) with which the gain error is the smallest within a range in which the sum np+nn+na is 30 to 33 is selected. As shown in FIG. 3C, the rms value of the gain error 0.07 dB, which shows that the gain setting accuracy is significantly improved as compared to the comparative example.

Figure 5:
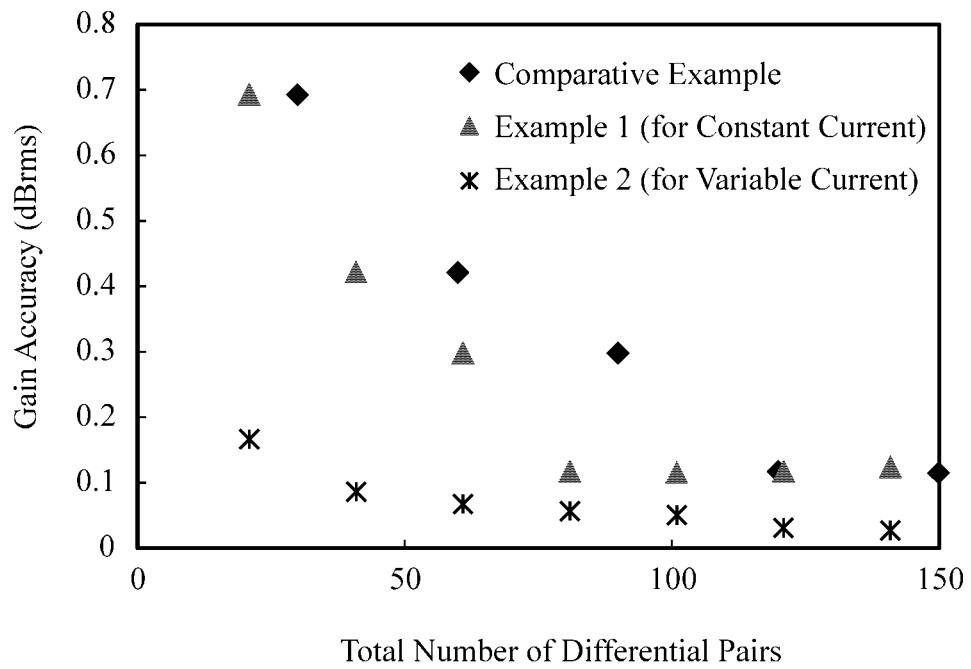
FIG. 5 is a graph showing the relation between the total number of differential pairs and gain accuracy.

FIG. 5 is a graph showing the relation of the gain accuracy with the total number of transistor pairs (total number of differential pairs). In the graph of FIG. 5, the horizontal axis represents the total number of differential pairs, and the vertical axis represents the rms value of the gain error (unit: dB). FIG. 5 shows that excellent gain accuracy is achieved even with a smaller number of transistor pairs in the cases of Examples 1 and 2 as compared to the case of the comparative example. Thus, in the cases of Examples 1 and 2, although the number of transistors in Examples 1 and 2 is about two-thirds the number of transistors in the comparative example, gain resolution equivalent to that in the comparative example is achieved. In addition, since parasitic capacitance in Examples 1 and 2 is smaller than that in the comparative example, Examples 1 and 2 achieves better high-frequency characteristics than the comparative example.

As described above, the first embodiment achieves high gain resolution with a relatively small number of transistors, and achieves excellent high-frequency characteristics.

While the transistors $TP_1$ to $TP_N$, $TN_1$ to $TN_N$, $RP_1$ to $RP_N$, and $RN_1$ to $RN_N$ constituting the non-inverted signal transmission circuit 10, the inverted signal transmission circuit 20, and the signal short circuit 30 may be of the same size of W/L (W: gate width, L: gate length) in the present embodiment, the present invention is not limited thereto. For example, the circuit configurations of the non-inverted signal transmission circuit 10 and the inverted signal transmission circuit 20 may be changed such that the non-inverted signal transmission circuit 10 and the inverted signal transmission circuit 20 are constituted by a plurality of transistor pairs whose sizes are powers of 2 (=$2^0, 2^1, 2^2, 2^3, \ldots$) times as large as a reference value of W/L. In this case, transistor pairs to be turned on can be selected with use of a binary code.

Second Embodiment

Figure 6:
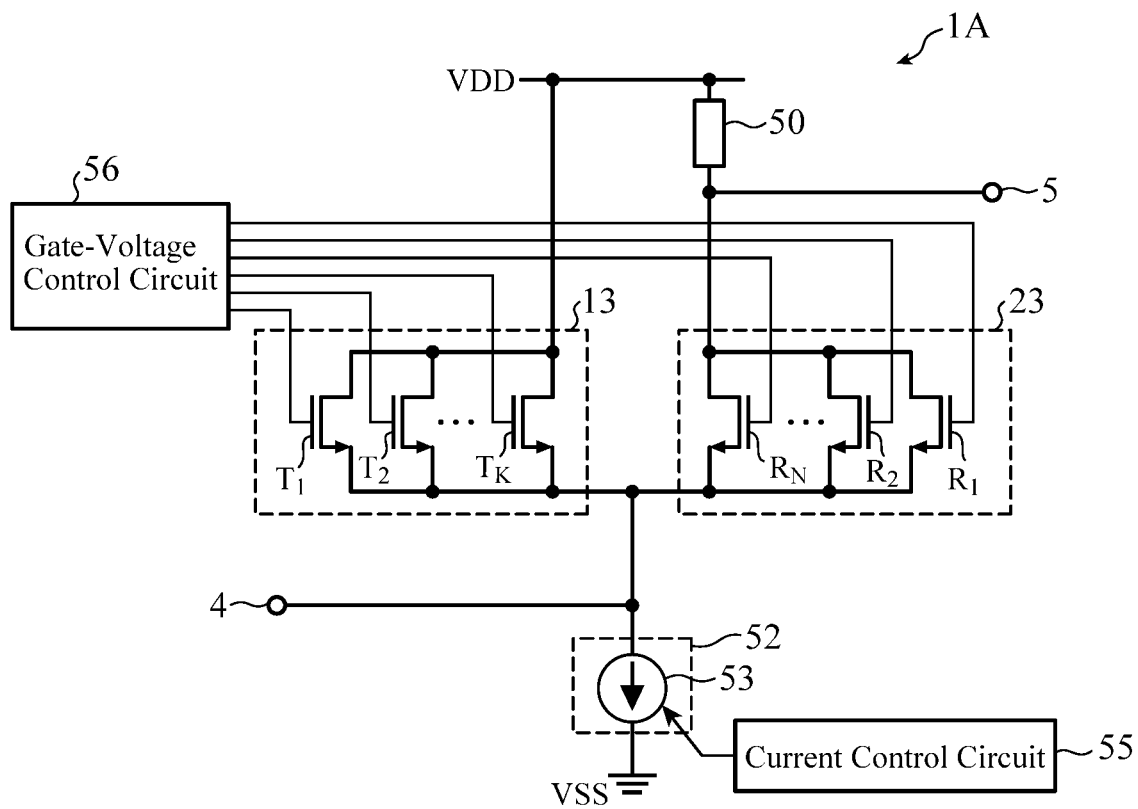
FIG. 6 is a schematic configuration diagram of a variable gain amplifier that is a second embodiment according to the present invention.
Figure 7:
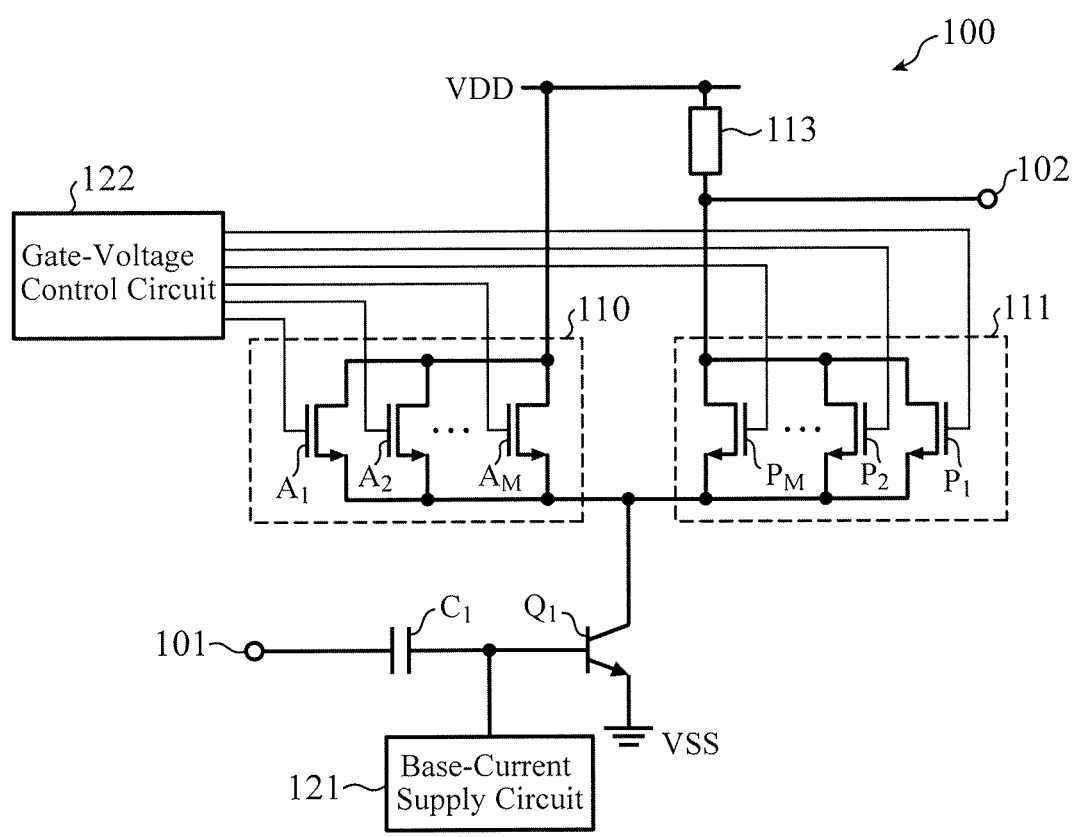
FIG. 7 is a configuration diagram of a variable gain amplifier of related art.

Next, a second embodiment according to the present invention will be described. The first embodiment is the variable gain amplifier 1 having the function of outputting differential signals having output phases inverted by 180 degrees from each other. In a case where the function of phase inversion is not necessary, the present embodiment can be used. FIG. 6 is a schematic configuration diagram of a variable gain amplifier 1A that is the second embodiment according to the present invention.

As illustrated in FIG. 6, the variable gain amplifier 1A includes a signal input terminal 4 that receives an input signal thereto, and a signal output terminal 5 that outputs an output signal, and has a configuration to achieve a single-ended input and a single-ended output. Note that the signal input terminal 4 constitutes a signal input port in the present embodiment, and the signal output terminal 5 constitutes a signal output port in the present embodiment.

The variable gain amplifier 1A also includes a signal transmission circuit 23 including N (N is an integer equal to or larger than 3) amplifying transistors $R_1$ to $R_N$, a signal short circuit 13 including K (K is an integer equal to or larger than 3) short-circuit transistors $T_1$ to $T_K$, a load resistor 50 constituted by a resistive element connected between a supply line of first power supply voltage VDD and an output end of the signal transmission circuit 23, and a constant-current source circuit 52 connected between a supply line of second power supply voltage VSS (VSS<VDD) and an input end of the signal transmission circuit 23. The power supply voltage VSS can be a ground potential of zero volts, for example.

The variable gain amplifier 1A also includes a gate-voltage control circuit 56 that functions as a transistor control circuit. The gate-voltage control circuit 56 selects a combination of transistors to be turned on, from among the amplifying transistors $R_1$ to $R_N$ and the short-circuit transistors $T_1$ to $T_K$, and supplies control voltage for turning on the selected combination of the transistors to the amplifying transistors $R_1$ to $R_N$ and the short-circuit transistor $T_1$ to $T_K$. The variable gain of the variable gain amplifier 1A is determined depending on the selected combination of the transistors.

The amplifying transistors $R_1$ to $R_N$ and the short-circuit transistor $T_1$ to $T_K$ are field-effect transistors, and can be n-channel MOSFETs, for example. Gates of the transistors are connected to the gate-voltage control circuit 56. The gate-voltage control circuit 56 is capable of switching the operation state of each of the transistors to either a turned-on state or a turned-off state by applying control voltages to the gates. The transistors when being turned on are controlled to serve as grounded-gate transistors with fixed gate voltages.

The variable gain amplifier 1A further includes a current control circuit 55 that variably controls the amount of current flowing through the constant-current source circuit 52. The constant-current source circuit 52 is constituted by one variable constant-current source 53, one end of which is connected to the signal input terminal 4. The other end of the variable constant-current source 53 is connected to the supply line of the second power supply voltage VSS. The current control circuit 55 is capable of variably controlling the amount of current flowing through the variable constant-current source 53.

One end of the load resistor 50 is connected to the supply line of the first power supply voltage VDD. The other end of the load resistor 50 is connected to drains (output ends) of the amplifying transistors $R_1$ to $R_N$. In addition, sources (input ends) of the amplifying transistors $R_1$ to $R_N$ are connected to both of the signal input terminal 4 and one end of the variable constant-current source 53. In addition, sources of the short-circuit transistor $T_1$ to $T_K$ are also connected to both of the signal input terminal 4 and one end of the variable constant-current source 53, and drains of the short-circuit transistor $T_1$ to $T_K$ are connected to the supply line of the first power supply voltage VDD.

While the number of amplifying transistors $R_1$ to $R_N$ included in the signal transmission circuit 23 is equal to or larger than three in the configuration of FIG. 6, the number is not limited thereto, but may be two. Similarly, the number of short-circuit transistor $T_1$ to $T_N$ included in the signal short circuit 13 is not limited to be equal to or larger than three, but may be one or two.

Next, operation of the variable gain amplifier 1A will be explained. A signal current input to the signal input terminal 4 flows into the signal transmission circuit 23 and the signal short circuit 13. Because the constant-current source circuit 52 is a high impedance circuit that applies a constant current, the signal current does not flow into the constant-current source circuit 52. The gate-voltage control circuit 56 selects a combination of transistors to be turned on depending on a set value of the gain, from among transistor groups of the signal transmission circuit 23 and the signal short circuit 13. The signal current is amplified with a gain depending on the combination, and output through the signal output terminal 5. Similarly to the gate-voltage control circuit 46 of the first embodiment, the gate-voltage control circuit 56 can select a combination of transistors to be turned on by using a thermometer code, for example.

When the number of transistors controlled to be in the turned-on states in the signal transmission circuit 23 is represented by np, and the number of transistors controlled to be in the turned-on states in the signal short circuit 13 is represented by na, a current gain Ci between the signal input terminal 4 and the signal output terminal 5 is expressed by the following expression (6):

$$Ci = np/(np+na). \tag{6}$$

Note that, as mentioned above, a gain of a high-frequency circuit is often expressed by a power gain, which is a ratio of an input power and an output power. Although Ci described above is not a power gain but a current gain, there is no problem in assuming that a gain of a high-frequency circuit is a current gain as a relative value since the current gain and the power gain satisfy a constant ratio when the input impedance of the circuit is constant. So as to make the input impedance constant, the variable gain amplifier 1A of the present embodiment has two kinds of operation modes (a first operation mode and a second operation mode).

When the variable gain amplifier 1A operates in the first operation mode, the gate-voltage control circuit 56 makes constant the sum np+na in the above expression (6), and the current control circuit 55 always makes constant the amount of current flowing through the constant-current source circuit 52.

In the variable gain amplifier 1A of the present embodiment, the input impedance $Z_{in}$ is expressed by the following expression (7) when the impedance of the constant-current source circuit 52 is assumed to be ideally infinite:

$$Z_{in} = 1/\{(np+na) \times g_m\}. \tag{7}$$

In the expression, $g_m$ represents transconductance per unit transistor, the transconductance $g_m$ being constant when the current flowing through the unit transistor is constant. Thus, when the sum np+na is a constant value, the input impedance $Z_{in}$ is also a constant value. A unit transistor in the present embodiment is each transistor having a corresponding size when np=1 or na=1.

Next, when the variable gain amplifier 1A operates in the second operation mode, the gate-voltage control circuit 56 and the current control circuit 55 make constant the product of the sum np+na and the amount of current flowing through the constant-current source circuit 52.

When a simplest model is given, the transconductance $g_m$ is expressed by the following expression (8) with respect to the current Id flowing through a unit transistor:

$$g_m \propto (Id)^{1/2}. \tag{8}$$

Thus, the transconductance $g_m$ is proportional to $(Id)^{1/2}$. In addition, when the amount of current flowing through the constant-current source circuit 52 is represented by $I_{tail}$, the following relational expression (9) is satisfied:

$$I_{tail} = (np+na) \times Id. \tag{9}$$

Thus, the input impedance $Z_{in}$ is expressed by the following expression (10):

$$Z_{in} \propto 1/\{(np+na) \times I_{tail}\}^{1/2}. \tag{10}$$

Thus, even when the sum np+na is not constant, the input impedance $Z_{in}$ can be made constant in such a manner that $I_{tail}$ is controlled so that $(np+na) \times I_{tail}$ is constant.

As described above, the variable gain amplifier 1A of the present embodiment has a configuration capable of improving the gain accuracy, similarly to the first embodiment, even with a smaller number of transistors in the signal short circuit 13. Thus, even with gain resolution equivalent to that in the related art, the variable gain amplifier 1A of the present embodiment is capable of reducing the parasitic capacitance and achieving excellent high-frequency characteristics. High gain resolution is therefore obtained with a relatively small number of transistors, and excellent high-frequency characteristics are achieved.

While the transistors $R_1$ to $R_N$, and $T_1$ to $T_K$ constituting the signal transmission circuit 23 and the signal short circuit 13 may be of the same size of W/L in the present embodiment, the present invention is not limited thereto. For example, the circuit configurations of the signal transmission circuit 23 and the signal short circuit 13 may be changed such that the signal transmission circuit 23 and the signal short circuit 13 are constituted by a plurality of transistors whose sizes are powers of 2 (=$2^0$, $2^1$, $2^2$, $2^3$, ...) times as large as a reference value of W/L. In this case, transistors to be turned on can be selected with use of a binary code.

Various embodiments according to the present invention have been described above with reference to the drawings; these embodiments, however, are merely examples of the present invention and various forms other than these embodiments may also be adopted. For example, while field-effect transistors are used for transistors constituting the non-inverted signal transmission circuit 10, the inverted signal transmission circuit 20, and the signal short circuit 30 in the first embodiment, the transistors are not limited thereto. Similarly, while field-effect transistors are used for transistors constituting the signal transmission circuit 23 and the signal short circuit 13 in the second embodiment, the transistors are not limited thereto. The configurations of the first and second embodiments may be changed so that the field-effect transistors are replaced by bipolar transistors.

Note that the first and second embodiments can be freely combined, any components in the embodiments can be modified, and any components in the embodiments can be omitted within the scope of the present invention.

INDUSTRIAL APPLICABILITY

A variable gain amplifier according to the present invention is suitable for use in a signal-amplitude control circuit such as a signal amplifier circuit or vector-sum phase shifting circuit of a communication device.

REFERENCE SIGNS LIST 1, 1A: variable gain amplifiers; 2P, 2N, 4: signal input terminals; 3P, 3N, 5: signal output terminals; 10: non-inverted signal transmission circuits; $11_1$ to $11_N$: transistor units; 13: signal short circuit; 20: inverted signal transmission circuit; $21_1$ to $21_N$: transistor unit; 23: signal transmission circuit; 30: signal short circuit; 31: transistor unit; 40: load circuit; 41P, 41N: load resistor; 42: constant-current source circuit; 43P, 43N: variable constant-current source; 45: current control circuit; 46, 47: gate-voltage control circuit; 50: load; 52: constant-current source circuit; 53: constant-current source; 55: current control circuit; 56: gate-voltage control circuit; $RP_1$ to $RP_N$, $RN_1$ to $RN_N$, $TP_1$ to $TP_N$, $TN_1$ to $TN_N$: amplifying transistor; and MP, MN: short-circuit transistor.

The invention claimed is:

1. A variable gain amplifier comprising:
a signal input port including a first signal input terminal for receiving a positive-phase input signal thereto, and a second signal input terminal for receiving a negative-phase input signal thereto;
a signal output port including a first signal output terminal for outputting a positive-phase output signal, and a second signal output terminal for outputting a negative-phase output signal;
a non-inverted signal transmission circuit having an input end connected to the signal input port and an output end connected to the signal output port, and including, as a part of a plurality of amplifying transistor units, a first transistor group connected in parallel between the first signal input terminal and the first signal output terminal, and a second transistor group connected in parallel between the second signal input terminal and the second signal output terminal;
an inverted signal transmission circuit having an input end connected to the signal input port and an output end connected to the signal output port, and including, as another part of the plurality of amplifying transistor units, a third transistor group connected in parallel between the first signal input terminal and the second signal output terminal, and a fourth transistor group connected in parallel between the second signal input terminal and the first signal output terminal;
a load circuit connected between a power supply line and the output end of the non-inverted signal transmission circuit and between the power supply line and the output end of the inverted signal transmission circuit;
a signal short circuit including one short-circuit transistor unit which is connected between the power supply line and the input end of the non-inverted signal transmission circuit and is connected between the power supply line and the input end of the inverted signal transmission circuit;
a constant-current source circuit including a first constant-current source connected to an_input end of the first transistor group and an input end of the third transistor group, and a second constant-current source connected to an input end of the second transistor group and an input end of the fourth transistor group; and
a transistor control circuit configured to select a prescribed number of transistor units to be turned on, from among the amplifying transistor units and the one short-circuit transistor unit, and configured to supply one or more control voltages for turning on the selected transistor units.

2. The variable gain amplifier according to claim 1, wherein:
the load circuit includes
a first load resistor connected between an output end of the first transistor group and the power supply line and between an output end of the third transistor group and the power supply line, and
a second load resistor connected between an output end of the second transistor group and the power supply line and between an output end of the fourth transistor group and the power supply line.

3. The variable gain amplifier according to claim 1, wherein:
the plurality of amplifying transistor units includes a plurality of amplifying transistors connected in parallel with each other;
an input end of each of the amplifying transistors is connected to the signal input port, and an output end of each of the amplifying transistors is connected to the signal output port;
the one short-circuit transistor unit includes a plurality of short-circuit transistors connected in parallel with each other;
an input end of each of the short-circuit transistors is connected to the signal input port, and an output end of each of the short-circuit transistors is connected to the power supply line; and
the constant-current source circuit is connected to the input end of each of the amplifying transistors and the input end of each of the short-circuit transistors.

4. The variable gain amplifier according to claim 3, wherein: each of the amplifying transistors when being turned on is controlled to be a transistor with a grounded gate; and each of the short-circuit transistors when being turned on is controlled to be a transistor with a grounded gate.

5. A variable gain amplifier comprising:
a signal input port including a first signal input terminal for receiving a positive-phase input signal thereto, and a second signal input terminal for receiving a negative-phase input signal thereto;
a signal output port including a first signal output terminal for outputting a positive-phase output signal, and a second signal output terminal for outputting a negative-phase output signal;
a non-inverted signal transmission circuit having an input end connected to the signal input port and an output end connected to the signal output port, and including, as a part of a plurality of amplifying transistor units, a first transistor group connected in parallel between the first signal input terminal and the first signal output terminal, and a second transistor group connected in parallel between the second signal input terminal and the second signal output terminal;
an inverted signal transmission circuit including, as another part of the plurality of amplifying transistor units, a third transistor group connected in parallel between the first signal input terminal and the second signal output terminal, and a fourth transistor group connected in parallel between the second signal input terminal and the first signal output terminal;
a load circuit connected between a power supply line and the output end of the non-inverted signal transmission circuit and between the power supply line and the output end of the inverted signal transmission circuit;
a signal short circuit including one short-circuit transistor unit which is connected between the power supply line and the input end of the non-inverted signal transmission circuit and is connected between the power supply line and the input end of the inverted signal transmission circuit;
a current source circuit including a first variable current source connected to an input end of the first transistor group and an input end of the third transistor group, and a second variable current source connected to an input end of the second transistor group and an input end of the fourth transistor group;
a transistor control circuit configured to select transistor units to be turned on, from among the amplifying transistor units and the one short-circuit transistor unit, and configured to supply one or more control voltages for turning on the selected transistor units; and a current control circuit configured to variably control a first amount of current flowing through the first variable current source to allow a product of the first amount of current and a total number of the selected transistor units to be constant, and configured to variably control a second amount of current flowing through the second variable current source to allow a product of the second amount of current and the total number of selected transistor units to be constant.

6. The variable gain amplifier according to claim 5, wherein:

the load circuit includes a first load resistor connected between an output end of the first transistor group and the power supply line and between an output end of the third transistor group and the power supply line, and a second load resistor connected between an output end of the second transistor group and the power supply line and between an output end of the fourth transistor group and the power supply line.

7. The variable gain amplifier according to claim 5, wherein:

the plurality of amplifying transistor units includes a plurality of amplifying transistors connected in parallel with each other;

an input end of each of the amplifying transistors is connected to the signal input port, and an output end of each of the amplifying transistors is connected to the signal output port;

the one short-circuit transistor unit includes a plurality of short-circuit transistors connected in parallel with each other;

an input end of each of the short-circuit transistors is connected to the signal input port, and an output end of each of the short-circuit transistors is connected to the power supply line; and the current source circuit is connected to the input end of each of the amplifying transistors and the input end of each of the short-circuit transistors.

8. The variable gain amplifier according to claim 7, wherein:

each of the amplifying transistors when being turned on is controlled to be a transistor with a grounded gate; and each of the short-circuit transistors when being turned on is controlled to be a transistor with a grounded gate.

\* \* \* \* \*